United States Patent
Chan et al.

(10) Patent No.: US 6,452,459 B1
(45) Date of Patent: Sep. 17, 2002

(54) CIRCUIT FOR MEASURING SIGNAL DELAYS OF SYNCHRONOUS MEMORY ELEMENTS

(75) Inventors: Siuki Chan, Cupertino; Christopher H. Kingsley, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/737,996

(22) Filed: Dec. 14, 2000

Related U.S. Application Data (63) Continuation-in-part of application No. 09/360,350, filed on Jul. 22, 1999, now Pat. No. 6,232,845.

(51) Int. Cl.$^7$ .................................................. H03B 5/02
(52) U.S. Cl. ........................ 331/57; 365/201; 324/617; 368/118; 368/120
(58) Field of Search ................................. 368/118, 120, 368/113; 331/57; 327/265; 324/617, 633; 365/201; 371/21.4

(56) References Cited

U.S. PATENT DOCUMENTS

| | | |
|---|---|---|
| 3,603,746 A | 9/1971 | Helck |
| 3,843,938 A | 10/1974 | Bergman |
| 4,510,429 A | 4/1985 | Squire |
| 4,691,121 A | 9/1987 | Theus |
| 4,792,932 A | 12/1988 | Bowhers et al. |
| 4,795,964 A | 1/1989 | Mahant-Shetti et al. |
| 4,857,868 A | 8/1989 | Robb |
| 4,878,209 A | 10/1989 | Bassett et al. |
| 4,890,270 A | 12/1989 | Griffith |
| 5,048,064 A | 9/1991 | Rutherford |
| 5,083,299 A | 1/1992 | Schwanke et al. |
| 5,097,208 A | 3/1992 | Chiang |
| 5,181,191 A | 1/1993 | Farwell |
| RE34,363 E | 8/1993 | Freeman |
| 5,294,559 A | 3/1994 | Malhi |
| 5,351,211 A | 9/1994 | Higetta et al. |
| 5,422,585 A | 6/1995 | Fan Chiangi et al. |
| 5,581,738 A | 12/1996 | Dombrowski |
| 5,606,567 A | 2/1997 | Agrawal et al. |
| 5,625,288 A | 4/1997 | Snyder et al. |
| 5,818,250 A | 10/1998 | Yeung et al. |
| 5,845,233 A | 12/1998 | Fishburn |
| 5,923,676 A | 7/1999 | Sunter et al. |
| 5,929,684 A | 7/1999 | Daniel |
| 5,973,976 A | 10/1999 | Sato |
| 6,057,691 A | 5/2000 | Kobayashi |

OTHER PUBLICATIONS

"The Programmable Logic Data Book", 1998, available from Xilinx, Inc. 2100 Logic Drive, San Jose, CA 95124, pp. 4–5 to 4–40.

Application Note from Xilinx, Inc., "Efficient Shift Registers, LFSR Counters, and Long Pseudo–Random Sequence Generators" by Peter Alfke, Jul. 7, 1996.

"Signal Delay in RC Tree Networks" IEEE Transaction on Computer–Aided Design, vol. CAD–2, No. 3, Jul. 1983, pp. 202–211.

*Primary Examiner*—Arnold Kinkead
(74) *Attorney, Agent, or Firm*—Arthur J. Behiel; Edel M. Young

(57) ABSTRACT

A circuit measures a signal propagation delay through a series of memory cells on a programmable logic device. In one embodiment, a number of RAM cells are configured in series. Each RAM cell is initialized to store a logic zero. The first RAM cell is then clocked so that the output of the RAM cell rises to a logic one. The resulting rising edge from the output of the RAM cell then clocks the second RAM cell, which in turn clocks the next RAM cell in the series. The time required for a rising edge to traverse the entire sequence of latches is the cumulative time required for the output of each RAM cell to change in response to a clock edge. Consequently, the delay through the series of RAM cells provides a measure of the time required for one of the RAM cells to store data in response to a clock edge. In another embodiment, the RAM cells are arranged in a loop so that the sequence of RAM cells forms a ring oscillator, the period of which provides an indication of the time required for the RAM cells to store data in response to clock edges.

23 Claims, 6 Drawing Sheets

CIRCUIT FOR MEASURING SIGNAL DELAYS OF SYNCHRONOUS MEMORY ELEMENTS

CROSS REFERENCE TO RELATED APPLICATIONS

This application is a continuation-in-part of U.S. patent application Ser. No. 09/360,350 entitled "Circuit for Measuring Signal Delays in Synchronous Memory Elements"Christopher H. Kingsley et al., filed Jul. 22, 1999 now U.S. Pat. No. 6,232,845.

This application is related to:

U.S. Pat. No. 6,075,418, entitled "System With Downstream Set or Clear for Measuring Signal Propagation Delays on Integrated Circuits," by Christopher H. Kingsley et al., issued Jun. 13, 2000;

U.S. patent application Ser. No. 09/115,204 now U.S. Pat. No. 6,233,205, entitled "Built-In Self Test Method For Measuring Clock To Out Delays," by Robert W. Wells et al., filed Jul. 14, 1998;

U.S. Pat. No. 5,790,479 entitled "Method for Characterizing Interconnect Timing Characteristics Using Reference Ring Oscillator Circuit" issued Aug. 4, 1998;

U.S. Pat. No. 6,069,849 entitled "Method and Circuit for Measuring Signal Propagation Delays Using the Duty Cycle of a Ring Oscillator," by Christopher H. Kingsley et al, issued May 30, 2000;

U.S. patent application Ser. No. 09/114,369, now U.S. Pat. No. 6,219,305 entitled "Method and System for Measuring Signal Propagation Delays Using Ring Oscillators," by Robert D. Patrie et al., filed Jul. 14, 1998;

U.S. patent application Ser. No. 09/244,753, entitled "Built-In AC Self Test Using Pulse Generators," by Gilbert A. Speyer et al., filed Feb. 5, 1999;

U.S. Pat. No. 6,005,829 entitled "Method for Characterizing Interconnect Timing Characteristics" issued Dec. 21, 1999; and U.S. Pat. No. 6,144,262, entitled "Circuit For Measuring Signal Delays of Asynchronous Register Inputs," by Christopher H. Kingsley, issued Nov. 7, 2000.

Each of the foregoing documents is incorporated herein by reference.

FIELD OF THE INVENTION

This invention relates generally to methods and circuit configurations for measuring signal propagation delays, and in particular for measuring signal propagation delays through synchronous memory elements.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that guarantee superior speed performance. This leads IC manufactures to carefully test the speed performance of their designs.

Figure 1:
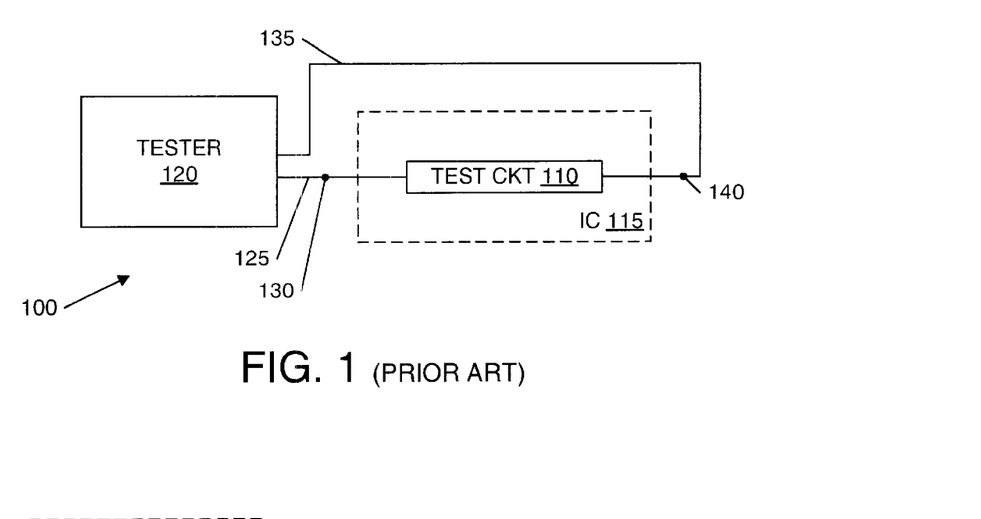
FIG. 1 depicts a conventional test configuration 100 for determining the signal propagation delay of a test circuit 110 in a conventional IC 115.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Conventional test procedures are problematic for at least two reasons. First, many signal paths within a given IC are not directly accessible via input and output pins, and therefore cannot be measured directly. Second, testers have tolerances that can have a significant impact on some measurements, particularly when the path of interest is relatively short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to advertise their full speed performance, which could cost them customers in an industry where speed performance is paramount.

Programmable logic devices (PLDS) are a well-known type of digital integrated circuit that may be programmed by a user (e.g., a circuit designer) to perform specified logic functions. One type of PLD, the field-programmable gate array (FPGA), typically includes an array of configurable logic blocks (CLBS) that are programmably interconnected to each other and to programmable input/output blocks (IOBs). This collection of logic is configured by loading configuration data into internal configuration memory cells that define how the CLBS, interconnections, and IOBs are configured.

Each programming point, CLB, interconnection line, and IOB introduces some delay into a signal path. The many potential combinations of delay-inducing elements make timing predictions particularly difficult. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

Manufacturers of ICs, including FPGAS, would like to achieve the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

SUMMARY

The present invention provides an accurate means of measuring IC speed performance. The inventive circuit is particularly useful for testing programmable logic devices, which can be programmed to include a device for testing a majority of the requisite test circuitry.

The time required for the output of a memory cell, such as a flip-flop or random-access memory (RAM) cell, to store data in response to a clock signal is a parameter of interest in modeling IC speed performance. In accordance with one embodiment of the invention, a number of memory cells are configured in series. Each cell is initialized to store a known logic level, a voltage level representative of a logic zero for example. In an embodiment in which the cells are initialized to store logic zeroes, the first memory cell is clocked so that the output of the cell changes to a level representative of a logic one. The rising edge associated with the transition of the output from zero to one then clocks a subsequent memory cell, causing the output of the second memory cell to transition from zero to one. This sequence of events continues from one memory cell to the next so that the rising edge propagates through all of the memory cells in the series.

Because the memory cells are clocked in sequence, the time required for a rising edge to traverse the entire series of memory cells is the sum of the delays associated with writing logic one data into each of the individual memory cells. Consequently, the delay through the series of memory cells can be used to determine the clock-to-out delays associated with the memory cells. In one embodiment, the memory cells are arranged in a ring so that the series of memory cells forms a ring oscillator. In that embodiment, an initial clock edge traverses the series of memory cells and is then fed back to the first memory cell to traverse the series again. The oscillator is equipped with feedback circuitry that returns each memory cell to the initialized state before the return of the clock edge so that the individual cells are prepared to change state upon the receipt of each subsequent rising edge. Thus, the delay through the series depends upon only one type of write operation (e.g. writing logic ones). Circuits in accordance with the invention thus allow for independent measurements of the clock-to-out delays associated with writing logic ones and logic zeroes.

One embodiment of the invention includes a ring of synchronous memory cells that includes at least one RAM cell. A synchronous output terminal of the RAM cell connects only to the subsequent memory cell, which is to say that the RAM cell has a fanout of one. Reducing the fanout to one improves the measurement of clock-to-out delay by removing some of the delay associated with driving additional devices. Some such embodiments include a second memory cell for each memory cell connected in series. The output of the second memory cell resets the series-connected memory cell, preparing the series-connected memory cell to receive a subsequent clock edge.

This summary does not limit the invention, which is defined instead by the claims.

DETAILED DESCRIPTION

Figure 2:
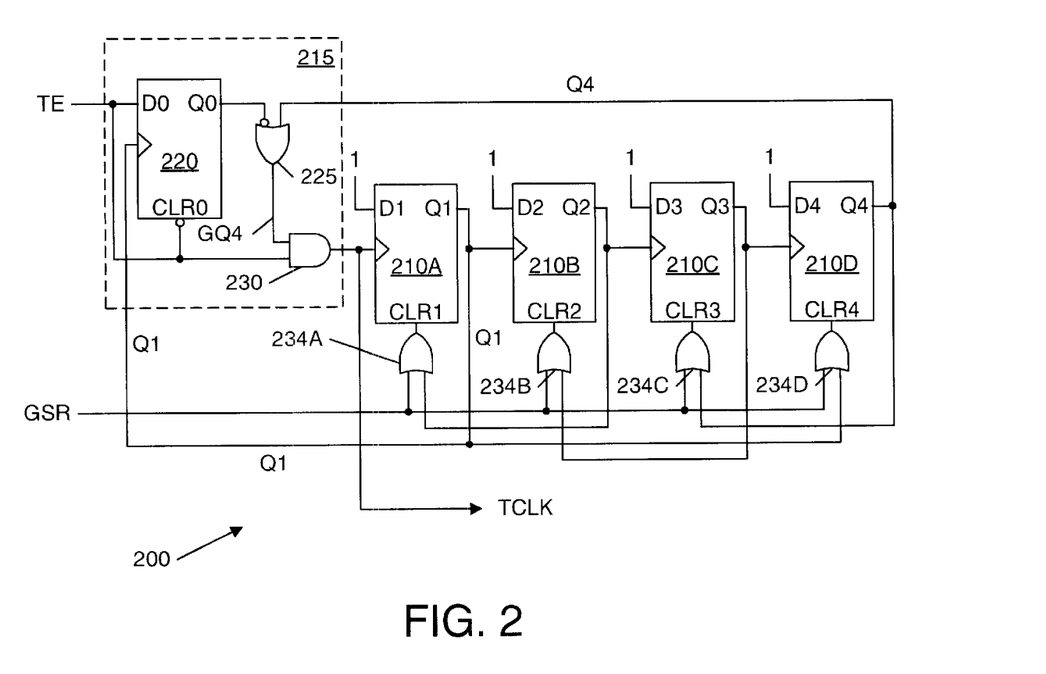
FIG. 2 is a schematic diagram of an oscillator 200 in accordance with an embodiment of the invention.

FIG. 2 is a schematic diagram of an oscillator 200. In accordance with the invention, the depicted configuration produces an oscillating test signal having a period including the clock-to-out delays of four synchronous components, flip-flops 210A–210D.

Oscillator 200 includes an oscillator-enable circuit 215 connected to the clock input of flip-flop 210A via a test-clock line TCLK. Oscillator-enable circuit 215 in turn includes a flip-flop 220, an OR gate 225 and an AND gate 230. As discussed below in connection with FIG. 3, oscillator-enable circuit 215 produces an edge on test-clock line TCLK when test-enable line TE is brought high. The rising edge causes oscillator 200 to begin oscillating. Returning test-enable line TE to a logic zero turns oscillator 200 off.

A test-enable line TE connects to a synchronous input terminal D0 of flip-flop 220, an asynchronous input terminal CLR0 of flip-flop 220, and an input terminal of AND gate 230. A global set/reset line GSR connected to the clear inputs CLR1–CLR4 of flip-flops 210A–210D via respective OR gates 234A–234D can be temporarily brought high initialize flip-flops 210A–210D before asserting test-enable TE. A synchronous output terminal Q0 of flip-flop 220 connects to an input of OR gate 225. The output terminal of OR gate 225 connects to the remaining input terminal of AND gate 230 via a line GQ4. Oscillator-enable circuit 215 also includes a pair of input lines Q1 and Q4 from respective flip-flops 210A and 210D: line Q1 connects to the clock input of flip-flop 220; line Q4 connects to the second input terminal of OR gate 225.

The synchronous "Q" output terminal of each flip-flop 210A–D is connected to:

the clock terminal (conventionally designated using a ">" symbol) of a subsequent flip-flop, and
  an asynchronous clear terminal of a previous flip-flop via a respective OR gate.

For example, output terminal Q3 of flip-flop 210C connects to both the clock terminal of flip-flop 210D and, through OR gate 234B, the asynchronous clear terminal CLR2 of flip-flop 210B. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a synchronous delay element between the output terminal and the clear terminal of the previous flip-flop. Output terminal Q4 from flip-flop 210D is connected, through circuit 215, to the clock input terminal of flip-flop 210A so that flip-flops 210A–2D form a ring oscillator.

Figure 3:
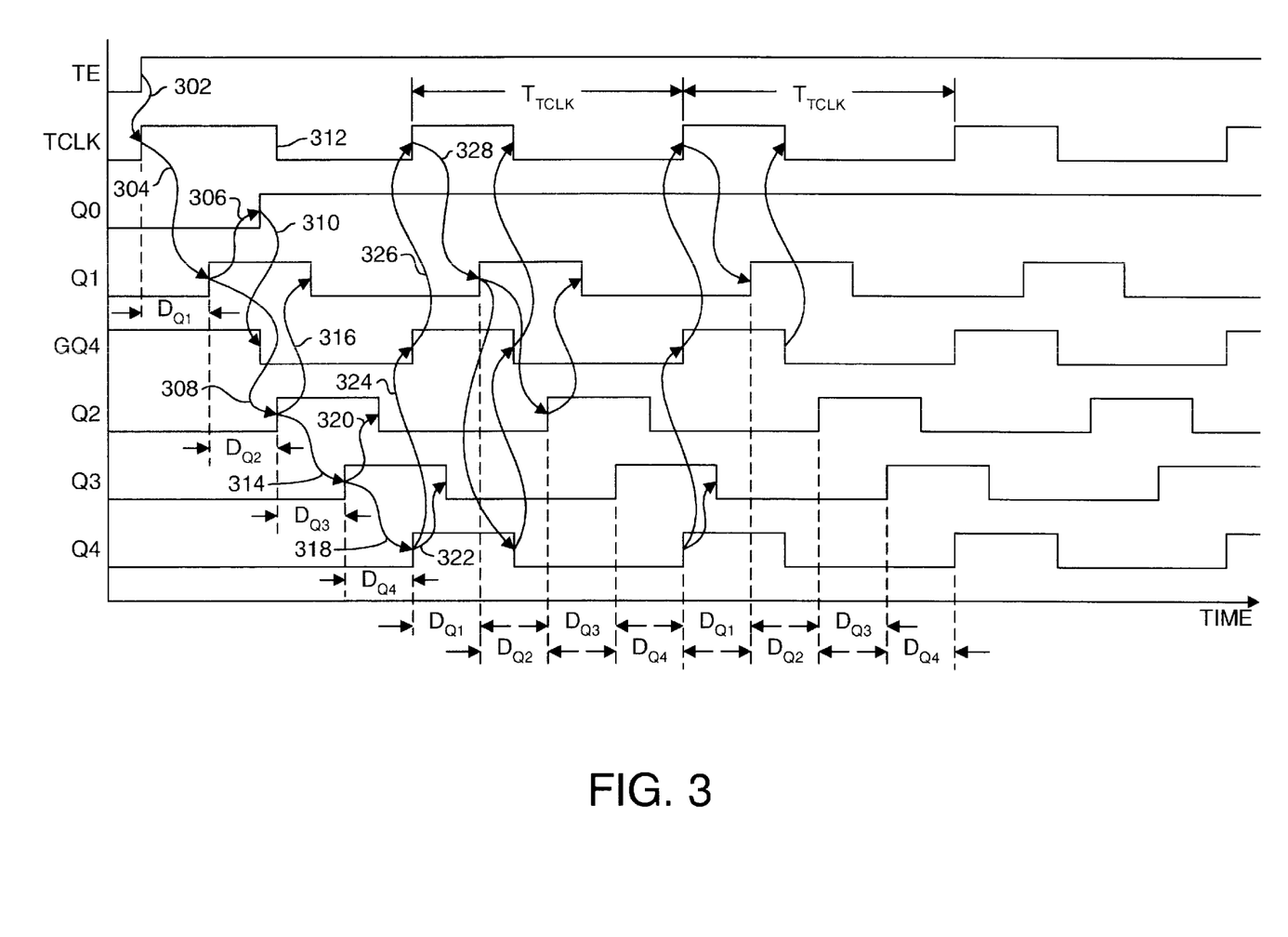
FIG. 3 is a waveform diagram depicting the operation of oscillator 200 of FIG. 2.

FIG. 3 is a waveform diagram depicting the operation of oscillator 200 of FIG. 2. Each waveform in FIG. 3 is labeled using the corresponding node designation depicted in FIG. 2. Lines terminating with differently named input and output nodes are named for output nodes. For example, the line connecting output terminal Q2 of flip-flop 210B to the clock terminal of flip-flop 210C and the clear terminal of flip-flop 210A is labeled "Q2." The node designations are hereafter used to alternatively refer to circuit nodes or their corresponding signals. In each instance, the interpretation of the node designations as either signals or physical elements is clear from the context.

Temporarily asserting global set/reset signal GSR clears flip-flops 210A–210D. Flip-flop 220 has an inverted clear terminal and is therefore cleared before signal TE is asserted. Thus, the respective "Q" output terminals of flip-flops 220 and 210A–210B are at logic zero. OR gate 225, having a logic zero on its inverting input from output terminal Q0, outputs a logic one on line GQ4.

A test cycle begins when test-enable line TE is asserted (brought to a logic one). Because line GQ4 is also a logic one, AND gate 230 passes the rising edge from test-enable signal TE to test-clock terminal TCLK (arrow 302), and consequently to the clock terminal of flip-flop 210A. The rising edge on the clock terminal of flip-flip 210A clocks flip-flop 210A so that the logic one on input terminal D1 transfers to output terminal Q1 after the clock-to-out delay $D_{Q1}$ associated with flip-flop 210A (arrow 304).

The rising edge of signal Q1 does two things. First, the rising edge of signal Q1 clocks flip-flop 210B so that the logic one on input D2 transfers to output terminal Q2 after the clock-to-out delay $D_{Q2}$ associated with flip-flop 210B (arrow 308). Second, the rising edge of signal Q1 clears flip-flop 210D. Clearing flip-flop 210D has no impact in the first instance of a rising edge on terminal Q1. However, as described below, each subsequent rising edge on test-clock line TCLK occurs when output Q4 of flip-flop 210D goes high; thus flip-flop 210D must be reset (cleared) to prepare TCLK for subsequent rising edges. Line Q0 remains at logic one for the duration of the test period, or as long as test-enable signal TE is asserted.

The rising edge on line Q0 produces a falling edge on line GQ4 (arrow 310), which in turn produces a falling edge 312 on line TCLK. Flip-flop 210A, a positive-edge-triggered flip-flop, is unaffected by falling edge 312. Falling edge 312 is important, however, because it prepares flip-flop 210A to respond to a subsequent rising clock edge.

The rising edge of signal Q2 clocks flip-flop 210C so that the logic one on input D3 transfers to output Q3 after the clock-to-out delay $D_{Q3}$ associated with flip-flop 210C (arrow 314). The rising edge of signal Q2 also clears flip-flop 210A, returning output terminal Q1 to a logic zero (arrow 316). The resulting rising edge of signal Q3 then clocks flip-flop 210D so that the logic one on input D4 transfers to output Q4 after the clock-to-out delay $D_{Q4}$ associated with flip-flop 210D (arrow 318). The rising edge of signal Q3 also clears flip-flop 210B (arrow 320). Finally, the rising edge on line Q4 clears flip-flop 210C (arrow 322) and propagates through OR gate 225 and AND gate 230 to clock flip-flop 210A once again (arrows 324 and 326). Oscillator 200 then continues to cycle a pulse through flip-flops 210A–D until test-enable line TE returns to a logic zero, which causes AND gate 230 to block the feedback from flip-flop 210D from clocking flip-flop 210A.

Cycling a pulse through flip-flops 210A–210D produces an oscillating test signal on test-clock terminal TCLK. The period $T_{TCLK}$ of the test signal includes the sum of clock-to-out delays $D_{Q3}$, $D_{Q2}$, $D_{Q3}$, and $D_{Q4}$.

Figure 4:
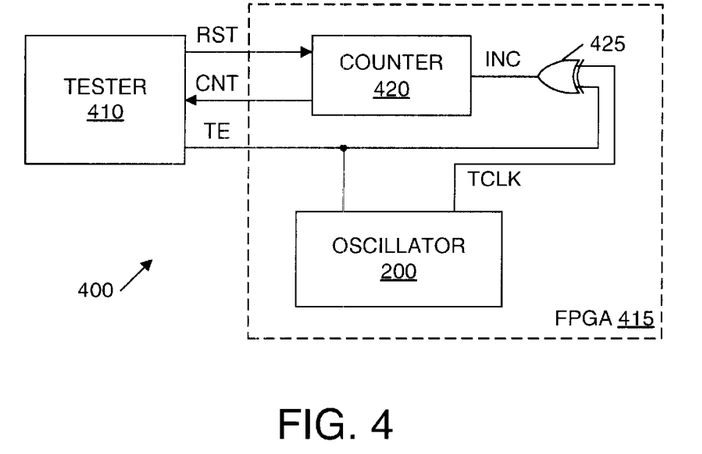
FIG. 4 is a schematic diagram of a system 400 for measuring test-clock period $T_{TCLK}$ of oscillator 200 of FIG. 2.

FIG. 4 is a schematic diagram of a system 400 for measuring test-clock period $T_{TCLK}$ of oscillator 200 of FIG. 2. System 400 includes a conventional tester 410 connected to an FPGA 415. In accordance with the invention, FPGA 415 is configured to include a counter 420, an XOR gate 425, and oscillator 200. System 400 may also be used with other types of oscillators, such as those described below in connection with FIGS. 5–8.

Test-clock line TCLK connects to counter 420 via OR gate 425. Counter 420 is a conventional binary counter adapted to count the number of rising edges on increment line INC from AND gate 425. Counter 420 connects to tester 410 via a test-count line CNT and a reset line RST. Reset line RST allows tester 410 to reset counter 420 to zero.

Tester 410 defines a test period by asserting test-enable signal TE. Oscillator 200 outputs an oscillating test-clock signal TCLK for as long as test-enable signal TE is asserted, and counter 420 increments for each rising edge of the test-clock signal TCLK. Thus, after test-enable line TE is asserted for the test period, counter 420 will contain the number of oscillations that oscillator 200 generated over the test period. This number is fed to tester 410 on line CNT. Calculating the period $T_{TCLK}$ of oscillator 200 is then a simple matter of dividing the test period by the number of counts stored in counter 420. For example, if test-enable line TE was held high for one second to achieve a count of 1,000, then the oscillation period $T_{TCLK}$ of oscillator 237 is one second divided by 1,000, or 1 millisecond.

System 400 provides a very accurate measure of the delay through oscillator 200 by counting over many cycles. Moreover, the method is relatively inexpensive to implement using FPGAs because FPGAs can be configured to simultaneously include many test circuits and the test circuitry (e.g., oscillator 200 and counter 420) required to test them. Elements 210A–D can also be employed as a delay element for measuring signal propagation delays. For example, elements 210A–D can be used in test configuration 100 in place of test circuit 110.

In practice, synchronous components can exhibit different propagation delays depending upon whether they are configured to respond to rising clock edges or falling clock edges. There is therefore a need for a way to determine the clock-to-out delays for synchronous components adapted to respond to falling clock edges.

Figure 5:
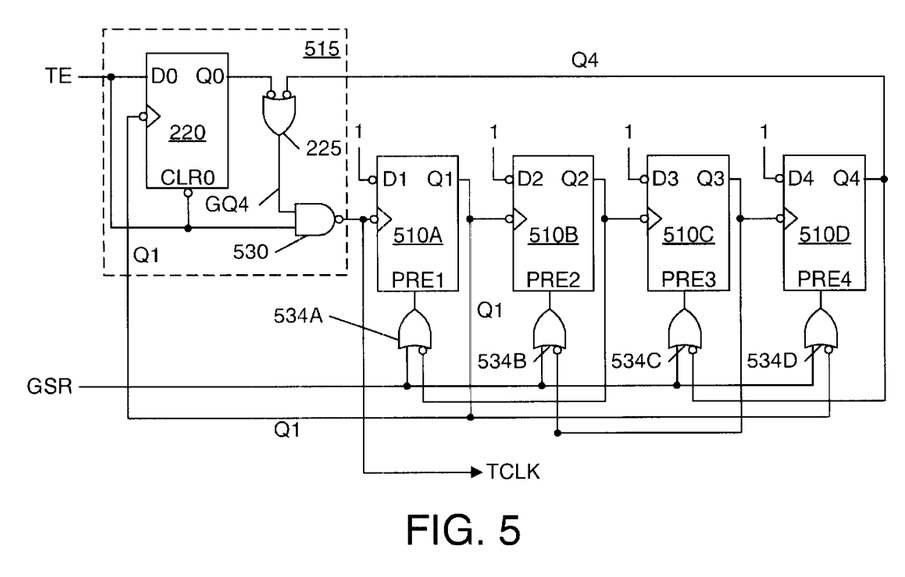
FIG. 5 is a schematic diagram of an oscillator 500 configured to produce a test-clock signal TCLK for which the period $T_{TCLK}$ includes the clock-to-out delays of flip-flops 510A–510D.

FIG. 5 is a schematic diagram of an oscillator 500 configured to produce a test-clock signal TCLK for which the period $T_{TCLK}$ includes the clock-to-out delays of flip-flops 510A–510D. Flip-flops 510A–510D are falling-edge triggered, as indicated by the "bubbles" on their respective clock terminals. The operation of oscillator 500 is similar to that of oscillator 200 of FIG. 2, except that the test-clock period $T_{TCLK}$ of oscillator 500 includes the delay associated with falling edges propagating through flip-flops 510A–510D, whereas the test-clock period $T_{TCLK}$ of oscillator 200 includes the delay associated with rising edges propagating through flip-flops 210A–210D. Due to the similarities of oscillators 200 and 500, a detailed description of the operation of oscillator 500 is omitted for brevity.

Flip-flops 510A–510D are similar to flip-flops 210A–210D. However, the respective "D" inputs are connected to logic zero, the clock terminals are negative-edge triggered, and instead of having feedback connections to clear inputs as in flip-flops 210A–210D, each of flip-flops 510A–510D has a feedback line connected through inverting inputs of one of OR gates 534A–534D to a respective preset terminal (e.g., output terminal Q2 of flip-flop 510B connects through OR gate 534A to preset terminal PRE of flip-flop 510A). Oscillator 500 also includes an oscillator-enable circuit 515 that is similar to oscillator-enable circuit 215, but differs in that the polarities of the DO clock input terminal of flip-flop 220 and the Q4 input terminal of NOR gate 225 are reversed, and AND gate 230 is replaced by a NAND gate 530.

Oscillator 200 of FIG. 2 and oscillator 500 of FIG. 5 can be used to determine, separately, the delays associated with falling and rising edges propagating through flip-flops of the type used to implement flip-flops 210A–D and 510A–D. The worst-case delay for such flip-flops can then be expressed as the longer of the two. Knowing the precise worst-case delay allows IC designers to minimize the guard band and consequently guarantee higher speed performance. In addition, knowing which type of signal transition propagates more slowly allows IC designers to optimize signal paths more efficiently by focusing on those components responsible for the slower performance.

Figure 6:
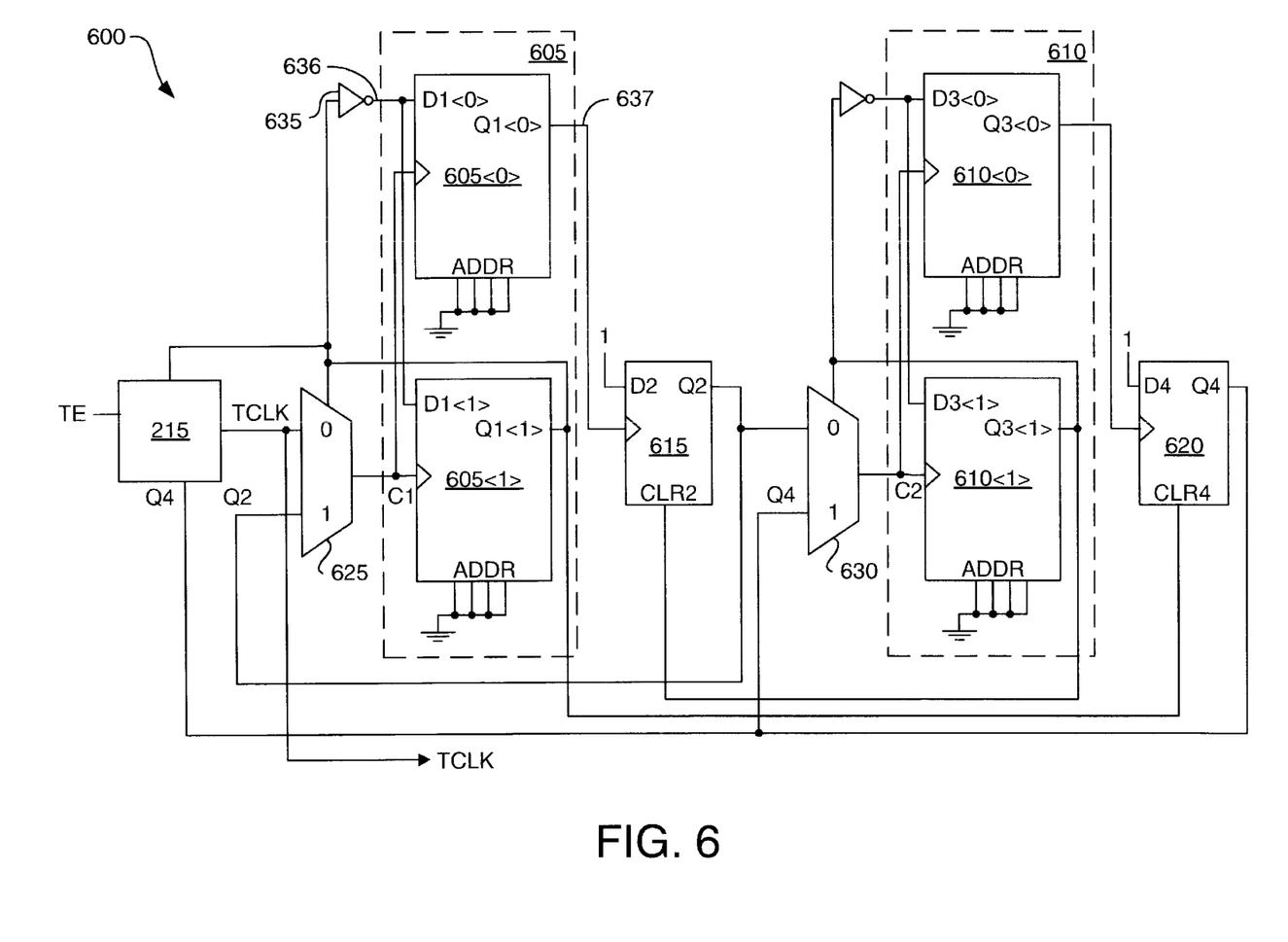
FIG. 6 depicts an oscillator 600 that can be used in accordance with the invention to measure clock-to-out delays associated with writing logic ones into random-access memory (RAM) cells.

FIG. 6 depicts an oscillator 600 that can be used in accordance with the invention to measure clock-to-out delays associated with random-access-memory (RAM) cells. Oscillator 600 includes a pair of two-bit RAM elements 605 and 610 connected in series with a pair of flip-flops 615 and 620 and a pair of multiplexers 625 and 630. This sequence of elements functions as a delay element for which the signal propagation delay of rising edges depends, in part, upon the time required to write logic ones into RAM elements 605 and 610. Oscillator-enable circuit 215, as described in connection with FIG. 2, provides the requisite feedback to allow oscillator 600 to oscillate.

Oscillator 600 is instantiated on the programmable logic device, which is to say that the elements are interconnected by configuring the PLD to define oscillator 600. In one embodiment, flip-flops 615 and 620 are preset to logic one during the configuration process.

RAM element 605 include two identically configured RAM cells 605<0> and 605<1>, each of which store one data bit. In the depicted embodiment, the address lines of each of RAM cells 605<0> and 605<1> are all separately tied to ground (a logic zero), so that address 0000 is selected. In other embodiments, the address lines can be tied together, different addresses may be used for one or both RAM elements, and the selected addresses need not be the same for both.

Figure 7:
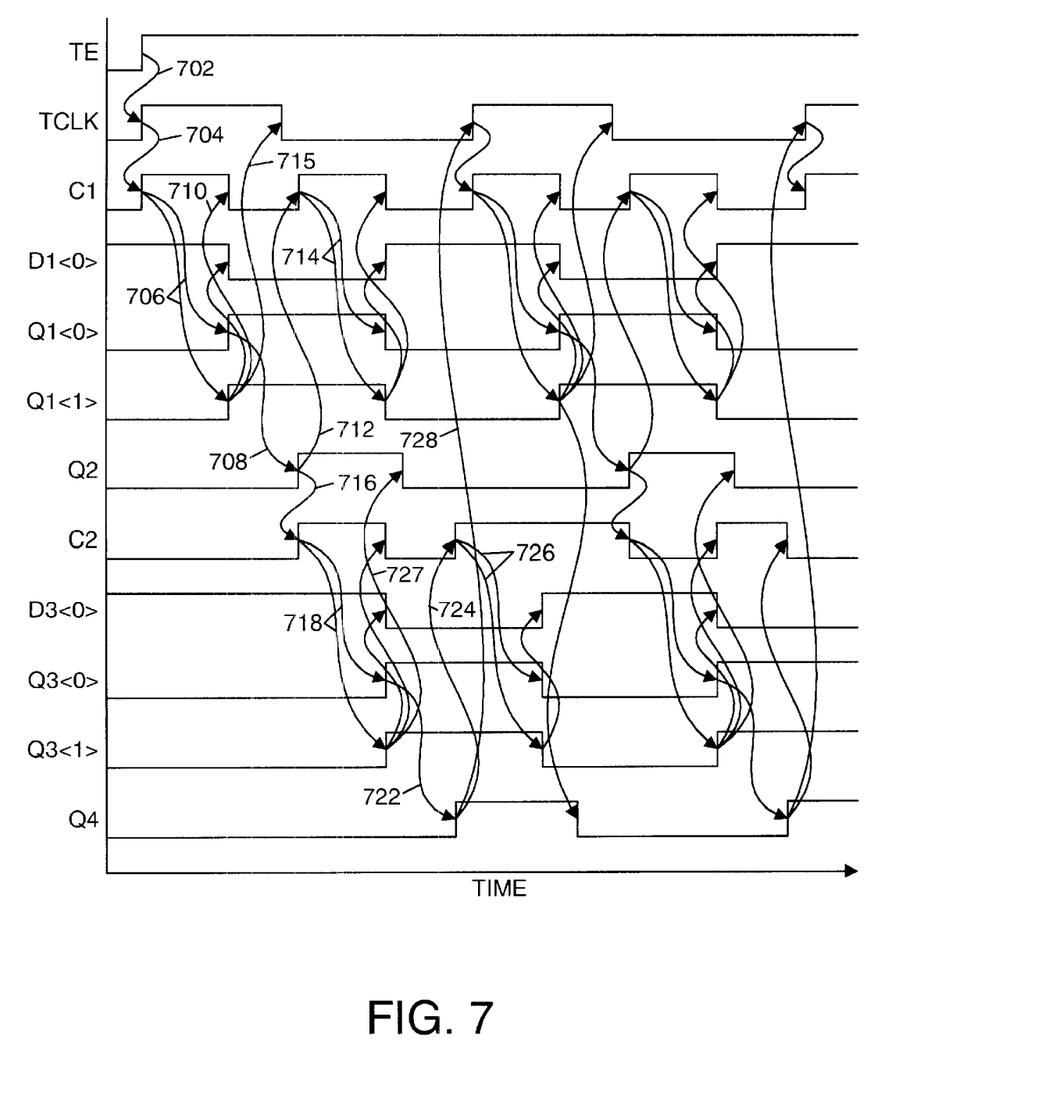
FIG. 7 is a waveform diagram 700 depicting the operation of oscillator 600 of FIG. 7.

FIG. 7 is a waveform diagram 700 depicting the operation of oscillator 600 of FIG. 7. Before beginning a test cycle, each memory element in oscillator 600 is preset to a logic zero. The contents of the RAM cells and flip-flops can be present during the configuration process. The Qoutputs of the various RAM elements and flip-flops are therefore logic zeros before test-enable signal TE is asserted.

Raising the test-enable signal TE initiates oscillation by raising the test-clock signal TCLK to a logic one (arrow 702). Multiplexer 625 passes the rising edge on terminal TCLK to the RAM-element clock input C1 (arrow 704) because RAM cell 605<1>, which contains a logic zero, connects terminal TCLK to clock input C1. The rising edge on clock input C1 clocks each of RAM elements 605<0> and 605<1>, causing the outputs of each of these to transition to logic one (arrows 706). The time period between the rising edge on clock input C1 and the rising edge on output terminal Q1<0>—the synchronous output terminal 637 of RAM element 605—is a measure of the clock-to-out delay for storing logic ones in RAM cell 605<0>. The transition on output terminal Q1<0> will be delayed slightly due to the larger fanout of RAM cell 605<1>; however, this increased delay will not affect the clock-to-out delay measurement performed using oscillator 600.

The rising edge on output terminal Q1<0> is fed to the clock input of flip-flop 615. Before flip-flop 615 has an opportunity to change states, the logic one on output terminal Q1<1> causes multiplexer 625 to select Q2, and therefore causes clock input C1 to transition back to a logic zero (arrow 710). Thus, when Q2 does go high after some clock-to-out delay associated with flip-flop 615 (arrow 708), multiplexer 625 passes the rising edge on terminal Q2 to clock input C1 (arrow 712), thereby clocking RAM cells 605<0,1>. An inverter 635 inverts the data signal provided from terminal Q1<1> to a synchronous RAM input terminal 636 of RAM element 605, which is connected to each synchronous input terminal D1<0> and D1<1> of respective RAM cells 605<0> and 605<1>. The rising edge clocks RAM cells 605<0,1> resets both RAM cells 605 and 610 to logic zero (arrows 714). The logic one from output terminal Q1<l> to oscillator-enable circuit 215 causes test-clock signal TCLK to return to a logic zero (arrow 715).

In addition to resetting RAM cells 605<0,1>, the rising edge on terminal Q2 also passes through multiplexer 630 to clock input C2 (arrow 716), and therefore clocks each of RAM cells 610<0,1> so their respective outputs Q3<0> and Q3<1>transition to logic one (arrows 718). The time period between the rising edge on clock input C2 and the rising edge on output terminal Q3<0> is a measure of the clock-to-out delay for storing logic ones in RAM cell 610<0>. The transition on output terminal Q3<1> will be delayed slightly due to the larger fanout of RAM cell 610<1> as compared with RAM cell 610<0>; however, this increased delay will not affect the period of the test-clock signal TCLK, and consequently will not affect the clock-to-out delay measurement performed using oscillator 600.

The rising edge on output Q3<0> is fed to the clock input of flip-flop 620. Before flip-flop 620 has an opportunity to change states, the logic one on output Q3<1>causes multiplexer 630 to select Q4, and therefore causes clock input C2 to transition back to a logic zero (arrow 720). Thus, when Q4 does go high after some clock-to-out delay associated with flip-flop 620 (arrow 722), multiplexer 630 passes the rising edge on terminal Q4 to clock input C2 (arrow 724), thereby clocking RAM cells 610<0,1> to reset them to logic zero (arrows 726). The logic one on output Q3<1> also clears flip-flop 615, preparing the flip-flop to respond to another clock edge (arrow 727). Output Q4 is fed back to oscillator-enable circuit 215, and causes the test-clock signal TCLK to return to logic one (arrow 728). The cycle thus begins anew, continuing until test-enable signal TE is returned to a logic zero (not shown).

The second rising edge on test-clock signal TCLK marks the end of the first test period. The test period is defined by the amount of time required for a rising edge to propagate through oscillator 600, and is substantially independent of the delays associated with falling edges.

Oscillator 600 can therefore be used to advantage in determining the time required for memory cells to transition for storing logic zeroes to storing logic ones.

Oscillator 600 is just one embodiment in which RAM cells having a fanout of one are used to determine clock-to-out delays. Other embodiments can use different circuit arrangements to reset the RAM cells. For example, RAM cell 605<1> could be substituted with a different type of memory element, such as a flip-flop, and multiplexers 625 and 630 could be replaced with other logic elements adapted to perform a similar function. Other modifications will be apparent to those of skill in the art.

Figure 8:
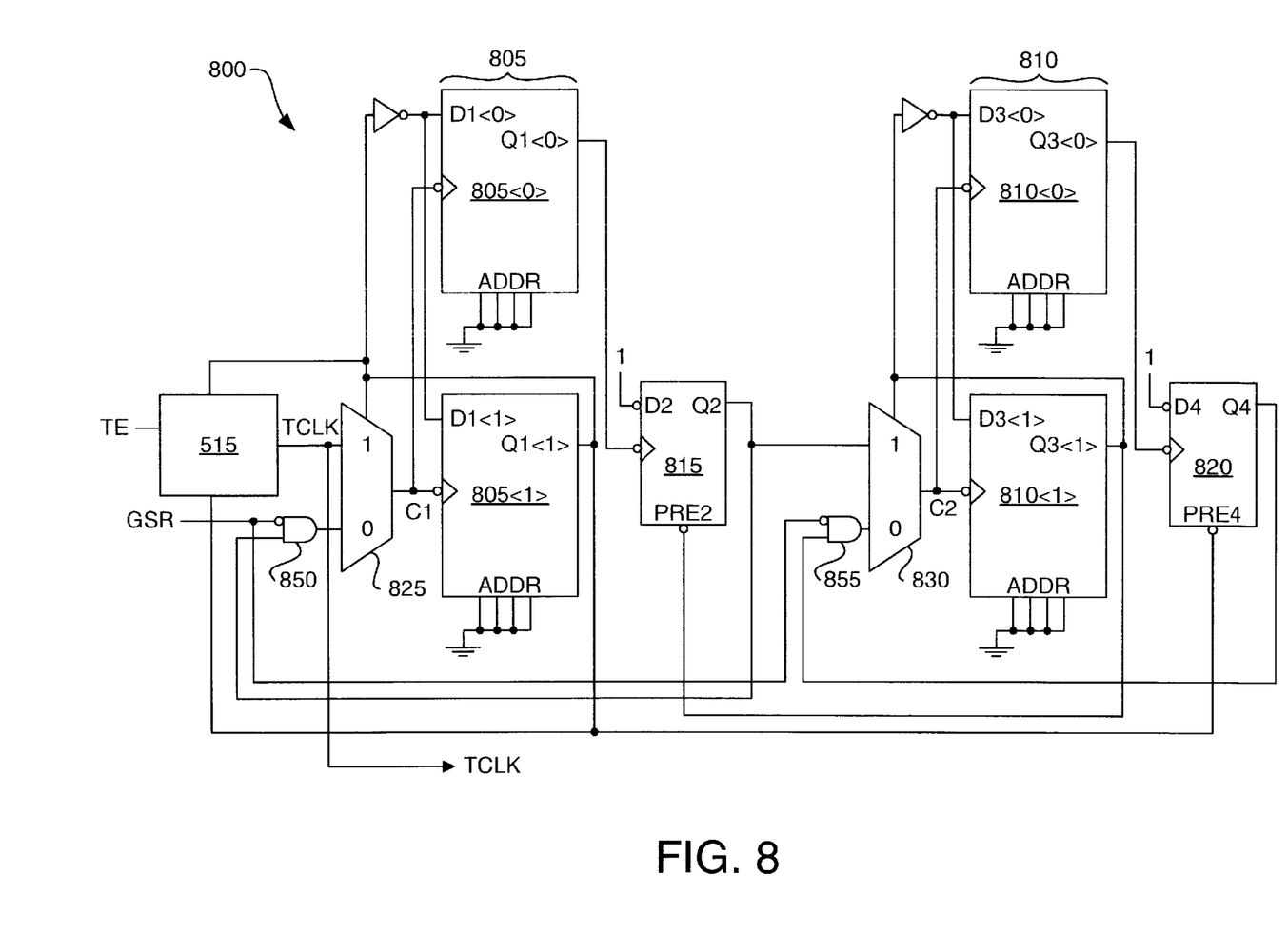
FIG. 8 depicts an oscillator 800 that can be used in accordance with the invention to measure clock-to-out delays associated with writing logic zeroes into RAM cells.

FIG. 8 depicts an oscillator 800 that can be used in accordance with the invention to measure clock-to-out delays associated with writing logic zeroes into RAM cells. Oscillator 800 includes a pair of two-bit RAM elements 805 and 810 connected in series with a pair of flip-flops 815 and 820 and a pair of multiplexers 825 and 830. This sequence of elements functions as a delay element from terminal TCLK to terminal Q4 for which the signal propagation delay of falling edges depends, in part, upon the time required to write logic zeroes into RAM elements 805 and 810. Oscillator-enable circuit 515, as described in connection with FIG. 5, provides the requisite feedback to allow oscillator 800 to oscillate.

"Bubbles" on various inputs to the devices shown in FIG. 8 conventionally indicate active-low logic levels and negative-edge-triggered clocks. Thus, for example, flip-flop 815 receives a logic zero (an inverted "1") on data input D2 and is clocked by high-to-low clock transitions.

As with oscillator 600 of FIG. 6, RAM elements 805 and 810 and flip-flops 815 and 820 are initialized to store logic zeroes. Oscillator 800 is designed to measure the time required to store logic zeroes, and so should be initialized such that the depicted RAM elements and flip-flops each store a logic one. Oscillator 800 therefore includes initialization circuitry that sets each of the depicted RAM cells and flip-flops to logic one in response to a global set/reset signal GSR. p The initialization circuitry of oscillator 800 includes a pair of AND gates 850 and 855 connected to multiplexers 825 and 830, respectively. The initialization circuitry additionally includes a feedback line that runs from output terminal Q1<1> to an inverted preset terminal PRE4 of flip-flop 820 and a feedback line that runs from output terminal Q3<1> to an inverted preset terminal PRE2 of flip-flop 815. The initialization circuitry responds to a positive pulse on terminal GSR as follows.

All the memory elements in oscillator 800 are initialized to store logic zeroes at start-up (e.g., when power is first applied to the programmable logic device or when the device is reset). Output terminals Q1<1> and Q3<1> connect to the inverted preset terminals PRE2 and PRE4; consequently, the logic zeros in RAM cells 805<1> and 810<1> preset flip-flops 815 and 820 to logic ones almost immediately upon start-up.

The logic-one levels from flip-flops 815 and 820 are present on one input terminal of respective AND gates 850 and 855. Before the global set/reset signal GSR is brought high, both AND gates 850 and 855 output logic ones. Further, these logic ones are present on clock terminals C1 and C2 because the logic zeroes from output terminals Q1<1> and Q3<1> select the lower inputs of multiplexers 825 and 830. Asserting a logic one on terminal GSR causes the outputs from AND gates 850 and 855 to fall, clocking each memory cell in RAM elements 805 and 810. The RAM cells thus change state in response to the transition on terminal GSR, and consequently retain logic one levels in response to the global set/reset signal GSR. Terminal GSR is then returned to a logic zero, leaving each memory element in oscillator 800 containing a logic one.

Asserting the test-enable signal on line TE causes oscillator 800 to oscillate. The period of oscillation depends upon the time required for falling edges to traverse the various memory elements of oscillator 800, and can be used to determine the time required to write logic zeroes into RAM cells 805<0> and 810<0> and flip-flops 825 and 830. Oscillator 800 works in much the same as oscillator 600 of FIG. 6, so a detailed explanation of oscillator 800 is omitted for brevity.

In the examples of FIGS. 6 and 8, all address terminals A0–A3 are tied to ground (i.e., logic zero) so that data written to the various RAM cells is written into address 0000. Other embodiments use different addresses, or even sequence through different addresses as the oscillator oscillates. For example, the address might increment by one for each period of oscillator 600. In other embodiments, random addresses might be selected.

The timing of each of the foregoing delay elements and oscillators depends on the delay of interest for the selected type of memory cell and upon the related interconnect and logic. Accurately determining the delay of interest is therefore somewhat more complex than simply dividing a given delay by the number of memory elements in the delay path. There are generally two approaches. The first compares the timing of a delay circuit or oscillator that includes a memory cell of interest with a nearly identical circuit without the memory cell. The delay difference between the two circuits is then presumed to be the contribution of the memory cell of interest. The second approach assigns each circuit element, or "primitive," in a number of different circuit configurations a different timing variable. The clock-to-Qdelay of a particular memory cell might be assigned one variable, while a certain buffer might be assigned another, for example. A series of equations can then be created by combining the delays associated with the various primitives in the different circuit configurations. The equations are then solved and the results compared with the measured timing values for the circuits that the equations are intended to simulate. Then, in a process commonly known as "back annotation," well-known mathematical principles are used to adjust the assigned timing variables for the various primitives to minimize the difference between actual measured data and simulated data gathered using the assigned variables. For a detailed discussion of one method for back-annotating timing constraints onto logic simulation models of integrated circuits, see U. S. Pat. No. 5,581,738, entitled "Method and Apparatus for Back-Annotating Timing Constraints into Simulation Models of Field Programmable Gate Arrays," by Peter F. Dombrowski, issued Dec. 3, 1996, and incorporated herein by reference.

All of the circuits described in connection with FIGS. 2 through 8 can be implemented in programmable logic devices, such as one of the Virtex™ series of FPGAs available from Xilinx, Inc., of San Jose, Calif. Devices, software, and methods used to accomplish general logic implementations are commercially available from Xilinx, Inc., and are well known to those of skill in the art. See, for example, chapter 3 of "The Programmable Logic Data Book," (1999), available from Xilinx, Inc., which is incorporated herein by reference.

While the present invention has been described in connection with specific embodiments, variations of these embodiments will be obvious to those of ordinary skill in the art. For example, the invention may be applied to types of memory cells not illustrated above. Other embodiments include additional signal paths for which the associated signal propagation delays are of interest. Examples of such embodiments are described in related applications that are incorporated above by reference. Therefore, the spirit and scope of the appended claims should not be limited to the foregoing description.

What is claimed is:

1. A delay circuit instantiated on a programmable logic device, the delay circuit comprising:
   a. a random-access memory (RAM) element having:
      i. a plurality of address terminals;
      ii. a RAM-element clock terminal;
      iii. a synchronous RAM-element input terminal; and
      iv. a synchronous RAM-element output terminal;
   b. a flip-flop having:
      i. a flip-flop clock terminal connected to the synchronous RAM-element output terminal; and
      ii. a synchronous flip-flop output terminal connected to the RAM-element clock terminal.

2. The delay circuit of claim 1, the RAM element further comprising:

a. a first RAM cell having:
   i. a first-RAM-cell output terminal connected to the RAM-element output terminal;
   ii. a first-RAM-cell clock input connected to the RAM-element clock terminal; and
   iii. a first-RAM-cell synchronous input terminal; and
b. a second RAM cell having:
   i. a second-RAM-cell output terminal;
   ii. a second-RAM-cell clock input connected to the RAM-element clock terminal; and
   iii. a second-RAM-cell synchronous input terminal connected to the first-RAM-cell synchronous input.

3. The delay circuit of claim 2, further comprising an inverter having an inverter input terminal connected to the second-RAM-cell output terminal and an inverter output terminal connected to the first-RAM-cell synchronous input terminal.

4. The delay circuit of claim 1, wherein the synchronous flip-flop output terminal is selectively connected to the RAM-element clock terminal.

5. The delay circuit of claim 4, further comprising a multiplexer having a multiplexer input terminal connected to the synchronous flip-flop output terminal and a multiplexer output terminal connected to the RAM-element clock terminal.

6. The delay circuit of claim 5, wherein the multiplexer further comprises a second multiplexer input terminal and a select terminal, and wherein the select terminal is connected to the synchronous RAM input terminal.

7. The delay circuit of claim 6, wherein the select terminal is connected to the synchronous RAM-element input terminal via an inverter.

8. The delay circuit of claim 1, further comprising an oscillator-enable circuit adapted to provide feedback from the synchronous RAM-element output terminal to the RAM-element clock terminal.

9. A programmable logic device configured to instantiate an oscillator, the oscillator comprising:
   a. a random-access memory (RAM) element having:
      i. first and second RAM cells, each RAM cell including a clock terminal, address terminals, a synchronous input terminal, and a synchronous output terminal;
      ii. a RAM-element clock terminal connected to the first-RAM-cell clock terminal and the second-RAM-cell clock terminal;
      iii. a synchronous RAM-element input terminal connected to the first-RAM-cell input terminal and the second-RAM-cell input terminal; and
   b. an inverter having:
      i. an inverter input terminal connected to at least one of the first-RAM-cell output terminal and the second-RAM-cell output terminal; and
      ii. an inverter output terminal connected to at least one of the first-RAM-cell input terminal and the second-RAM-cell input terminal.

10. The programmable logic device of claim 9, wherein the first and second RAM cells are adapted to generate rising and falling signal transitions on the respective first and second RAM-cell output terminals, and wherein each of the rising and falling signal transitions clocks the first and second RAM cells.

11. The programmable logic device of claim 9, wherein the oscillator further comprises a flip-flop having a flip-flop clock terminal, a synchronous flip-flop input terminal, a synchronous flip-flop output terminal, and an asynchronous flip-flop input terminal, wherein the flip-flop clock terminal is connected to the RAM-element output terminal.

12. The programmable logic device of claim 11, wherein the oscillator further comprises a logic element connected between the synchronous flip-flop output terminal and the RAM-element clock terminal.

13. The programmable logic device of claim 12, wherein the logic element is a multiplexer having a first multiplexer input terminal connected to the synchronous flip-flop output terminal, a multiplexer output terminal connected to the RAM-element clock terminal, and a second multiplexer input terminal.

14. The programmable logic device of claim 9, wherein the first RAM cell has a fanout of one.

15. A programmable logic device configured to instantiate an oscillator, the oscillator comprising:
   a. a first random-access memory (RAM) cell having a first clock terminal, address terminals, a first synchronous input terminal, and a first synchronous output terminal;
   b. a second RAM cell having a second clock terminal, a second synchronous input terminal, and a second synchronous output terminal; and
   c. means connected to the first and second synchronous output terminals for generating a rising edge on the first clock terminal in response to rising and falling edges on the second synchronous output terminal.

16. The programmable logic device of claim 15, further comprising an inverter connected between the second synchronous output terminal and the first synchronous input terminal.

17. A programmable logic device configured to instantiate an oscillator, the oscillator comprising:
   a. a ring of synchronous memory cells, including at least one RAM cell, each having a clock terminal connected to a preceding memory cell in the ring;
   b. wherein signal transitions on each clock terminal traverse the ring of synchronous memory cells; and
   c. wherein the RAM cell has a fanout of not more than one.

18. The programmable logic device of claim 17, further comprising a second RAM cell having a second-RAM-cell output terminal connected to a synchronous input terminal of the first-mentioned RAM cell in the ring of synchronous memory cells.

19. The programmable logic device of claim 18, wherein the RAM cell and the associated second RAM cell have interconnected RAM-cell clock terminals.

20. The programmable logic device of claim 17, wherein the synchronous memory cells include synchronous output terminals and clock terminals, and wherein the synchronous output terminal of each memory cell in the ring is connected to the clock terminal of a subsequent memory cell in the ring.

21. The programmable logic device of claim 20, wherein one or more of the synchronous memory cells are flip-flops.

22. The programmable logic device of claim 21, wherein at least two of the memory cells are RAM cells separated by a flip-flop.

23. A method of measuring the clock-to-out delay of a random-access memory cell on a programmable logic device, the method comprising:
   a. configuring the programmable logic device to include an oscillator, the oscillator including:
      i. a ring of synchronous memory cells, including at least one RAM cell, each memory cell having a clock terminal connected to a preceding memory cell in the ring;
      ii. wherein signal transitions on each clock terminal traverse the synchronous memory cells in the ring; and iii. wherein the RAM cell in the series has a fanout of not more than one;

b. providing an signal transition on one of the clock terminals to induce oscillation of the oscillator; and c. measuring at least one of the period or the frequency of the oscillator.

* * * * *